(12) United States Patent
Hartono et al.

(10) Patent No.: US 7,486,530 B2
(45) Date of Patent: Feb. 3, 2009

(54) METHOD OF COMPARISON BETWEEN CACHE AND DATA REGISTER FOR NON-VOLATILE MEMORY

(75) Inventors: Hendrik Hartono, San Jose, CA (US); Benjamin Louie, Fremont, CA (US); Aaron Yip, Santa Clara, CA (US); Hagop A. Nazarian, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 49 days.

(21) Appl. No.: 11/116,842

(22) Filed: Apr. 28, 2005

(65) Prior Publication Data

US 2006/0245272 A1  Nov. 2, 2006

(51) Int. Cl.
G11C 15/00 (2006.01)
G11C 7/06 (2006.01)
G11C 16/04 (2006.01)

(52) U.S. Cl. ............. 365/49.1; 365/49.16; 365/49.17; 365/189.07; 365/185.17; 365/185.33

(58) Field of Classification Search .......... 365/49, 365/189.07, 185.08, 185.17, 185.21, 185.22, 365/185.29, 185.33, 49.1, 49.16, 49.17, 49.18
See application file for complete search history.

(56) References Cited

U.S. PATENT DOCUMENTS

| | | | | |
|---|---|---|---|---|
| 4,959,811 A | * | 9/1990 | Szczepanek | 365/189.07 |
| 5,715,426 A | * | 2/1998 | Takahashi et al. | 365/189.07 |
| 5,845,309 A | * | 12/1998 | Shirotori et al. | 365/189.07 |
| 5,873,112 A | | 2/1999 | Norman | |
| 5,982,675 A | * | 11/1999 | Fujimoto | 365/189.07 |
| 6,115,291 A | | 9/2000 | Lakhani | |
| 6,122,197 A | * | 9/2000 | Sinai et al. | 365/185.08 |
| 6,324,088 B1 | | 11/2001 | Keeth | |
| 6,438,665 B2 | | 8/2002 | Norman | |
| 6,452,825 B1 | | 9/2002 | Keeth | |
| 6,535,410 B2 | * | 3/2003 | Yanagawa | 365/49 |
| 6,798,710 B2 | * | 9/2004 | Roohparvar et al. | 365/185.33 |
| 6,829,737 B1 | | 12/2004 | McBride | |
| 6,906,954 B2 | * | 6/2005 | Shukuri et al. | 365/185.08 |
| 6,975,542 B2 | * | 12/2005 | Roohparvar | 365/185.33 |

\* cited by examiner

*Primary Examiner*—Trong Phan
(74) *Attorney, Agent, or Firm*—Leffert Jay & Polglaze, P.A.

(57) ABSTRACT

A non-volatile memory device and data comparison circuit are described that facilitate the comparison of data between two blocks of data, such as the I/O buffer or data cache of a memory and the sense amplifiers, that allow for simple and rapid comparison of data bits and results in a signal flag indicating a data match or a mis-match. This allows for a simple parallel data bit comparison capability that allows a fast initial comparison result without requiring a time-consuming individual bit-by-bit data comparison. In one embodiment, two data blocks to be compared are divided into a number of paired segments, wherein each pair of segments are compared in parallel by a data comparison circuit, such that a mis-match can be located to the affected data segments or the results logically combined to indicate a match or mis-match for the complete data blocks.

20 Claims, 3 Drawing Sheets

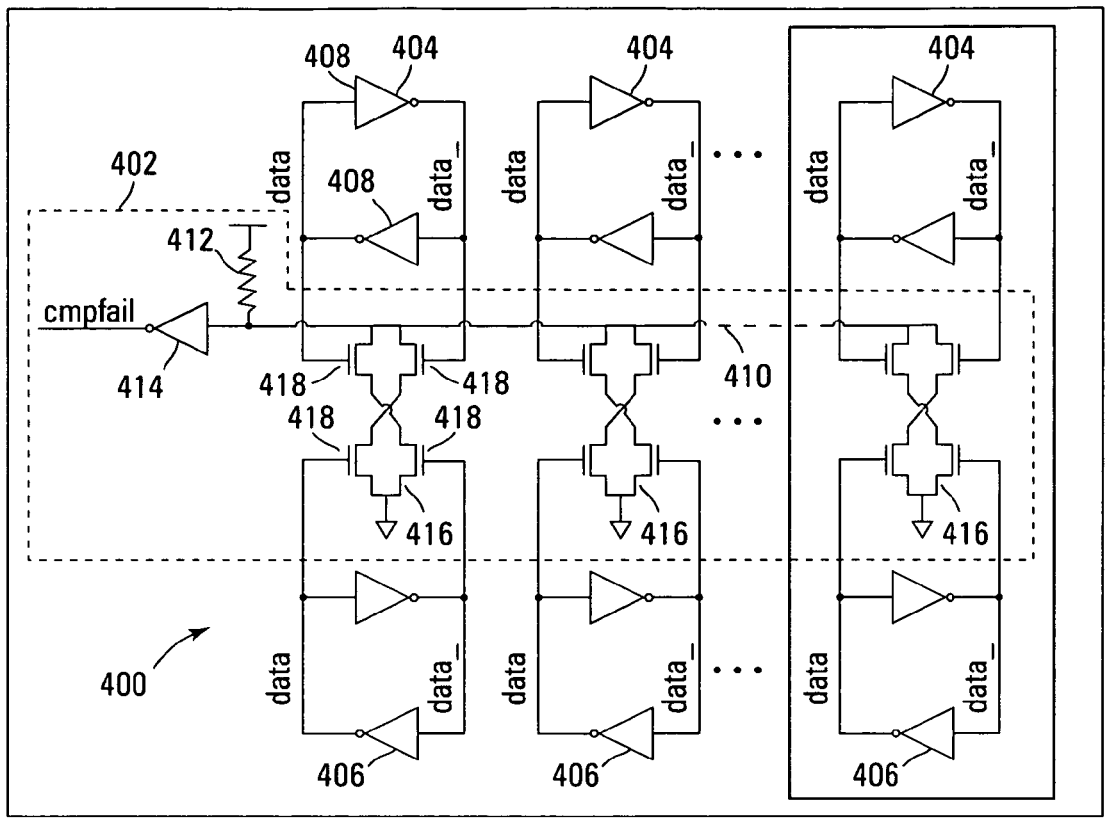
FIG. 4A
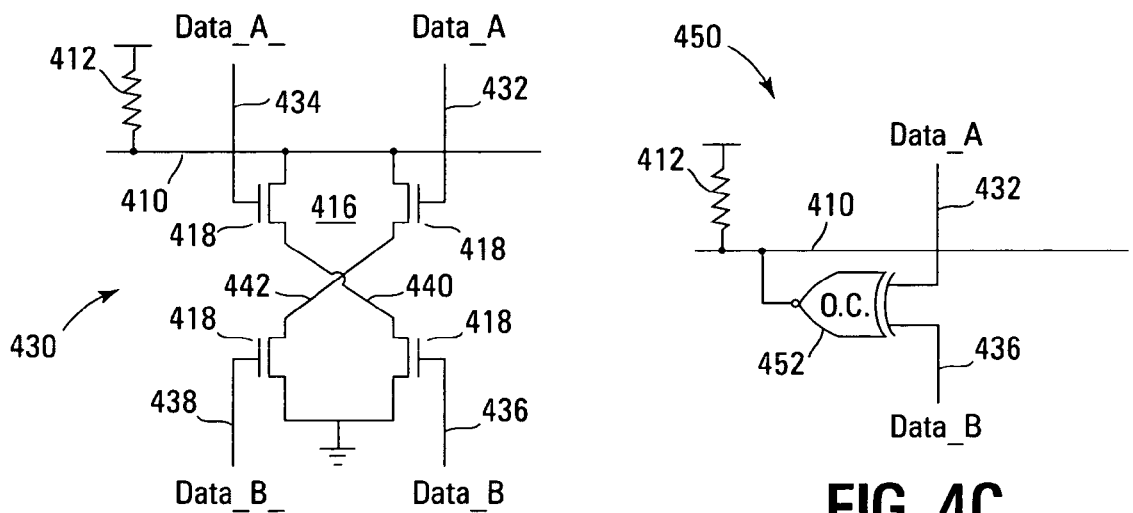
FIG. 4B
FIG. 4C

METHOD OF COMPARISON BETWEEN CACHE AND DATA REGISTER FOR NON-VOLATILE MEMORY

TECHNICAL FIELD OF THE INVENTION

The present invention relates generally to integrated circuits and in particular the present invention relates to data comparison in non-volatile memory devices.

BACKGROUND OF THE INVENTION

Memory devices are typically provided as internal storage areas in a computer. The term memory identifies data storage that comes in the form of integrated circuit chips. There are several different types of memory used in modern electronics, one common type is RAM (random-access memory). RAM is characteristically found in use as main memory in a computer environment. RAM refers to read and write memory; that is, you can both write data into RAM and read data from RAM. This is in contrast to ROM (read-only memory), which permits you only to read data. Most RAM is volatile, which means that it requires a steady flow of electricity to maintain its contents.

Computers almost always contain a small amount of ROM that holds instructions for starting up the computer, typically called a basic input output system (BIOS). Unlike RAM, ROM generally cannot be written to by a user. An EEPROM (electrically erasable programmable read-only memory) is a special type of non-volatile ROM that can be erased and programmed by exposing it to an electrical charge. EEPROM comprise a large number of memory cells having electrically isolated gates (floating gates). Data is stored in the memory cells in the form of charge on the floating gates. Charge is transported to or removed from the floating gates by specialized programming and erase operations.

Yet another type of non-volatile memory is a Flash memory. A Flash memory is a type of EEPROM that can be erased and reprogrammed in blocks instead of one byte at a time. A typical Flash memory comprises a memory array, which includes a large number of memory cells. Each of the memory cells includes a floating gate field-effect transistor capable of holding a charge. The data in a cell is determined by the presence or absence of the charge in the floating gate. The cells are usually grouped into sections called "erase blocks." The memory cells of a Flash memory array are typically arranged into a "NOR" architecture (each cell directly coupled to a bitline) or a "NAND" architecture (cells coupled into "strings" of cells, such that each cell is coupled indirectly to a bitline and requires activating the other cells of the string for access, but allowing for a higher cell density). Each of the cells within an erase block can be electrically programmed in a random basis by charging the floating gate. The charge can be removed from the floating gate by a block erase operation, wherein all floating gate memory cells in the erase block are erased in a single operation. It is noted that other types of non-volatile memory exist which include, but not limited to, Polymer Memory, Ferroelectric Random Access Memory (FeRAM), Ovionics Unified Memory (OUM), Magnetoresistive Random Access Memory (MRAM), Molecular Memory, Nitride Read Only Memory (NROM), and Carbon Nanotube Memory.

Each erase block of a Flash memory device contains a series of physical pages that are typically each written to a single row of the Flash memory array and include one or more user data areas and associated control or overhead data areas. The control/overhead data areas contain overhead information for operation of physical row page and the user data area each overhead data space is associated with. Such overhead information typically includes, but is not limited to, erase block management (EBM) data, sector status information, or an error correction code (ECC). ECC's allow the Flash memory and/or an associated memory controller to detect data errors in the user data area and attempt to recover the user data if possible.

Many of the internal operations of volatile and non-volatile memories require that the memory perform data comparisons. Typically this data comparison is performed in the context of comparing data that has been read from the memory array with the data that was expected to be read in order to find discrepancies. The internal operations requiring data comparison include, but are not limited to, data write, block erasure, and memory testing. A problem with many modern memory devices and arrays is that, because of their increasing storage density levels and increasing size of each physical page/row of data of the array, this data comparison within the memory device has become a time consuming task and can affect the speed of operation, data throughput, and testing time required.

For the reasons stated above, and for other reasons stated below which will become apparent to those skilled in the art upon reading and understanding the present specification, there is a need in the art for circuits and methods to allow fast and efficient comparison of large amounts of data within memory devices.

SUMMARY OF THE INVENTION

The above-mentioned problems with data comparison in volatile and non-volatile memory devices and other problems are addressed by the present invention and will be understood by reading and studying the following specification.

Volatile and non-volatile memory devices and data comparison circuits, in accordance with embodiments of the present invention, incorporate specialized comparison circuits that facilitate the comparison of data between the I/O buffer or data cache of a memory and the sense amplifiers that allow for simple and rapid comparison small or large numbers of data bits and results in a signal flag indicating a data match or a mis-match. This allows for a simple parallel data bit comparison capability that allows a fast initial comparison result without requiring a time consuming individual bit-by-bit data comparison. In another embodiment of the present invention, two data blocks to be compared are divided into a number of paired segments, wherein each pair of segments are compared in parallel by a data comparison circuit, such that a mis-match can be located to the affected data segments or the results logically combined to indicate a match or mis-match for the complete data blocks.

For one embodiment, the invention provides a memory device comprising a memory array having a plurality of memory cells arranged in rows and columns, a plurality of sense amplifiers coupled to the memory array, a data cache coupled to the plurality of sense amplifiers, and a data comparison circuit coupled between the data cache and the plurality of sense amplifiers, wherein the data comparison circuit is adapted to compare the data values held in the sense amplifiers and the data cache and signal a data match or data mismatch on a common error signal line.

For another embodiment, the invention provides a data comparison circuit comprising a first and second plurality of data input signal lines, a plurality of bit comparators coupled to the first and second plurality of data input signal lines, a common error signal line coupled to each of the plurality of bit comparators, and a pull-up circuit coupled to the common error signal line.

For yet another embodiment, the invention provides a bit comparator circuit comprising first and second data input, wherein each data input has a normal and inverted signal line, a common error signal line, a pull-up circuit coupled to the common error signal line, a first series-coupled transistor chain, having a first and second transistors coupled in series, wherein the first series-coupled chain is coupled to the common error signal line and to a low signal level power rail, and where a control gate of the first transistor is coupled to the normal signal line of the first data input and a control gate of the second transistor is coupled to the inverted signal line of the second data input, and a second series-coupled transistor chain, having a first and second transistors coupled in series, wherein the second series-coupled chain is coupled to the common error signal line and to a low signal level power rail, and where a control gate of the first transistor is coupled to the inverted signal line of the first data input and a control gate of the second transistor is coupled to the normal signal line of the second data input.

For a further embodiment, the invention provides a method of operating a memory comprising reading a first data segment from a memory array utilizing a plurality of sense amplifiers, comparing the first data segment held in the sense amplifiers with a second data segment held in a data cache with a data comparator circuit, and generating a signal indicative of the compare result if the bits of the first and second data segment mismatch.

For yet a further embodiment, the invention provides a bit comparator circuit comprising first and second data input, a common error signal line, a pull-up circuit coupled to the common error signal line, and an open collector XNOR gate having a first and second inputs and an open collector output, wherein the first XNOR input is coupled to the first data input, the second XNOR input is coupled to the second data input, and the open collector output is coupled to the common error signal line.

Further embodiments of the invention include methods and apparatus of varying scope.

BRIEF DESCRIPTION OF THE DRAWINGS

FIGS. 4A to 4C detail bit comparison circuits in accordance with embodiments of the present invention.

DETAILED DESCRIPTION OF THE INVENTION

Figure 1:
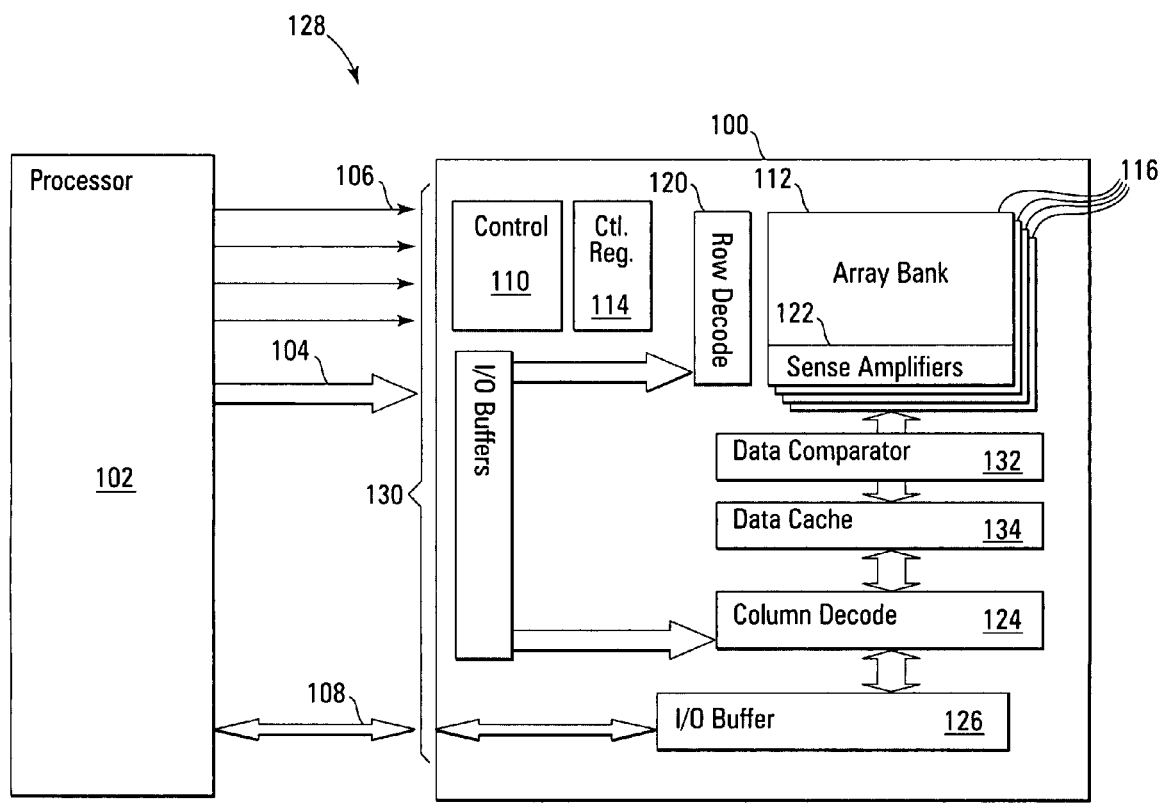
FIG. 1 details a simplified block diagram of a system containing a non-volatile memory device in accordance with an embodiment of the present invention.

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

As stated above, non-volatile memory devices and data comparison circuits, in accordance with embodiments of the present invention, incorporate specialized comparison circuits that facilitate the comparison of data between the I/O buffer or data cache of a memory and the sense amplifiers that allow for simple and rapid comparison small or large numbers of data bits and results in a signal flag indicating a data match or a mis-match. This allows for a simple parallel data bit comparison capability that allows a fast initial comparison result without requiring a time consuming individual bit-by-bit data comparison. In one embodiment of the present invention, two data blocks to be compared are divided into a number of paired segments, wherein each pair of segments are compared in parallel by a data comparison circuit, such that a mis-match can be located to the affected data segments or the results logically combined to indicate a match or mis-match for the complete data blocks.

Many of the internal operations of volatile memories, Flash memories and other types of non-volatile memories require that the memory perform data comparisons. Typically this data comparison is performed in the context of comparing data that has been read from the memory array with the expected data in order to find errors. Internal operations requiring data comparison can include, but are not limited to, data write, block erasure, and memory testing. With the large data storage density of modern memory devices, it is not unusual for each row/page of the memory array to have 16 kilobits of individual data values each, and each memory array to contain multiple giga-bits of data storage, particularly in non-volatile memory devices. These increasingly larger data sizes make the serial read out and comparison of data prohibitive in general memory operation.

In a program operation of a page/row of the memory array, after the data is programmed to the array, it is typically immediately read again from memory array so that the data can be verified. In this verification, the data that was programmed in the memory array is compared with the original data typically still being held in the I/O buffer or data cache to discover any errors and ensure it was properly programmed. If an error is discovered, the location is typically invalidated and the data moved to a new location to be programmed into the array once again. It is noted that, in some cases, if data that fails verification in a programming operation but has errors that are correctable utilizing the ECC code, it can be allowed to remain in the original location of the non-volatile memory and the ECC code relied upon to correct the error when the location is accessed.

In block erasure, the block selected for erasure is typically erased with a series of high voltage erase pulses. The contents of the newly erased block are then read to verify that they were completely erased and soft programmed to "heal" any overerased memory cells. Data comparison is used during the verification portion of this erase cycle to confirm that the memory cells of each row of the erase block has been completely erased and that no further erase pulses are required. Verification is then typically used to locate and mark any bad rows or sectors of the array so that they are not used.

During memory manufacture the memory arrays of memory devices are tested to find and repair flawed sections of the array with redundant memory array sections (redundant rows and columns) that are available for this purpose. Some memory devices also run tests at start-up or upon a user request to test the integrity of the array and/or locate bad blocks or sections. In this testing, data test patterns that are designed to locate specific array flaws (stuck at "1" or "0"

memory cells, shorted/open bitlines and columns, etc.) are written to the memory array. Once the selected test pattern has been programmed into the array, it is read back and compared against the expected or original pattern that is still resident in, or has been loaded into, the data cache or IO buffer of the memory. These memory tests typically require the comparison of large amounts of data but allow the manufacturer or end user to discover and correct/compensate for faults in the memory array.

It is noted that other operations within memory devices that utilize data comparison are possible and will be apparent to those skilled in the art with the benefit of the present disclosure.

Embodiments of the present invention utilize a data comparison circuit to quickly compare data in memory devices, providing a single binary signal to indicate a comparison match or failure. In one embodiment of the present invention, a data comparison circuit is divided into sections to piecewise compare segments of two portions of data, allowing a data error to be isolated to a particular segment. This allows for a simple parallel data bit comparison capability that allows a fast comparison result without requiring a time-consuming individual bit-by-bit data comparison.

Data comparison circuits of the present invention contain a plurality of individual bit comparators that perform a parallel bit-by-bit comparison and are coupled to a common signal line. If a pair of data bits of the data segments being tested in a bit comparator of a data comparison circuit of an embodiment of the present invention mis-match, the comparison circuit testing the bits indicates the error by expressing a signal on the common signal line. In one embodiment of the present invention, this common signal line is coupled to a pull-up circuit, such as a resistor or a weak transistor, which pulls the common signal line high. A bit comparator which detects a data bit mis-match will then assert a signal and indicate an error by pulling down the common signal line against the pull-up circuit and overriding it. This arrangement allows one or more bit comparators to indicate a data bit mis-match upon the common line without signal conflict.

It is noted that other common signal line signaling arrangements are possible, such as a pull-down circuit which is pulled up to indicate an error, and will be apparent to those skilled in the art with the benefit of the present disclosure.

As stated above, the data comparison in embodiments of the present invention can be broken up by sections to allow errors to be quickly localized to a particular section. This allows a specific bit error to be located by only scanning the section indicating an error of the data segments being compared, instead of having to scan the entire data segment for the indicated error. The common error indication signal lines of these individual comparison sections can be coupled together utilizing an OR gate or an AND gate (depending on the logic state indicating an error) to logically combine the individual outputs and provide a single error signal output for the data segments being compared.

Sectioned data comparison circuit of embodiments of the present invention may also be utilized to compare smaller data segments by ignoring output the comparator sections not loaded with data to compare. It is noted that data comparisons of smaller data segments may also be accomplished in sectioned and non-sectioned data comparison circuits of embodiments of the present invention by padding unutilized portions of each data segment with the same data, such as all zeros, all ones, or a known pattern. It is also noted that data comparison can be used to quickly compare a segment of data with multiple memory locations within the memory array to locate a specific data segment, data signature, or portion (such as header or tail) of a larger data block which is to be located.

FIG. 1 shows a simplified diagram of a system 128 incorporating a non-volatile memory device 100 embodiment of the present invention coupled to a host 102, which is typically a processing device or memory controller. In one embodiment of the present invention, the non-volatile memory 100 is a NOR architecture Flash memory device or a NAND architecture Flash memory device. It is noted that memory device 100 embodiments of the present invention incorporating other non-volatile memory arrays 112 of differing technology and architecture types (including, but not limited to, Polymer memory, FeRAM, OUM, MRAM, Molecular memory, and Carbon Nanotube memory) are also possible and should be apparent to those skilled in the art with the benefit of the present disclosure. The non-volatile memory device 100 has an interface 130 that contains an address interface 104, control interface 106, and data interface 108 that are each coupled to the processing device 102 to allow memory read and write accesses. It is noted that other memory interfaces 130 that can be utilized with embodiments of the present invention exist, such as a combined address/data bus, and will be apparent to those skilled in the art with the benefit of the present disclosure. In one embodiment of the present invention, the interface 130 is a synchronous memory interface, such as a SDRAM or DDR-SDRAM interface. Internal to the non-volatile memory device, an internal memory controller 110 directs the internal operation; managing the non-volatile memory array 112 and updating RAM control registers and non-volatile erase block management registers 114. The RAM control registers and tables 114 are utilized by the internal memory controller 110 during operation of the non-volatile memory device 100. The non-volatile memory array 112 contains a sequence of memory banks 116. Each bank 116 is organized logically into a series of erase blocks (not shown). Memory access addresses are received on the address interface 104 of the non-volatile memory device 100 and divided into a row and column address portions.

On a read access the row address is latched and decoded by row decode circuit 120, which selects and activates a row/page (not shown) of memory cells across a selected memory bank. The bit values encoded in the output of the selected row of memory cells are coupled to a local bitline (not shown) and a global bitline (not shown) and are detected by sense amplifiers 122 associated with the memory bank. The sense amplifiers 122 include a data cache or data latch 134 which latches the sensed data from the sense amplifiers 122 once it has been sensed/read from the physical row/page of the bank 116. In one embodiment of the present invention, this latching of the sensed data into the data cache allows the sense amplifiers to be released to sense the next page of memory. The column address of the access is latched and decoded by the column decode circuit 124. The output of the column decode circuit 124 selects the desired column data from the internal data bus (not shown) that is coupled to the outputs of the data cache 134 holding the data from the individual read sense amplifiers 122 and couples them to an I/O buffer 126 for transfer from the memory device 100 through the data interface 108. It is noted that in other memory device 100 embodiments of the present invention, the output of the column decode circuit 124 selects the desired column data directly from the outputs of the individual read sense amplifiers 122 and couples them to the I/O buffer 126, allowing the data cache 134 to be eliminated.

On a write access the row decode circuit 120 selects the row page and column decode circuit 124 selects write sense amplifiers 122. Data values to be written are coupled from the I/O buffer 126 via the internal data bus to the data cache 134 and the write sense amplifiers 122 selected by the column decode circuit 124. The data is then written to the selected non-volatile memory cells (not shown) of the memory array 112. The written cells are then reselected by the row and column decode circuits 120, 124 and sense amplifiers 122 so that they can be read to verify that the correct values have been programmed into the selected memory cells.

The non-volatile memory device 100 contains a data comparison circuit 132 coupled between the data cache 134 and the sense amplifiers 122 to allow data comparison between the data segment held in the data cache 134 and row of data values currently sensed by the sense amplifiers 122. In another memory embodiment of the present invention, the data comparison circuit 132 is coupled directly between the I/O buffer 126 and the sense amplifiers 122.

The data comparison circuit 132 is utilized during a program operation of a page/row of the memory array 112 of the memory device 100 of FIG. 1. As stated above, after the data is programmed to the array 112, it is subsequently read again from the array 112 by the sense amplifiers 122 so that the data can be verified. In this verification, the data that was programmed in the array 112 is compared with the original data that is still being held in the cache 134 to discover any errors and ensure it was properly programmed. During a block erasure of the memory device 100, the erase block selected from the array 112 for erasure is typically erased with a series of high voltage erase pulses. The contents of the newly erased block are then read to verify that they were completely erased. The data comparison circuit 132 is used during the verification portion of this erase cycle to confirm that the memory cells of each row of the erase block has been completely erased by loading all logical 1's into the data cache 134 (flash memory cells are typically erased to a logical 1 state and changed to a logical 0 state when programmed) and reading and comparing each row of the newly erased block to the data cache 134 with the data comparator circuit 132 to verify that no further erase pulses are required. The data comparator circuit 132 is also used during memory manufacture of the memory device 100 to test, find, and repair flawed sections of the array 112 with redundant memory array sections (not shown) that are available for this purpose. In this testing, data test patterns that are designed to locate specific array flaws are written to the memory array 112. Once the selected test pattern has been programmed into the array 112, it is read back row by row by the sense amplifiers 122 and compared against the expected pattern that is still resident in, or has been loaded into, the data cache 134.

It is noted that other architectures of non-volatile memory devices, systems, external interfaces, and/or manners of coupling the memory controller/host to the non-volatile memory device(s), such as multiple memory devices with global or directly coupled individual control busses and signal lines, are possible and will be apparent to those skilled in the art with benefit of the present disclosure.

Figure 2:
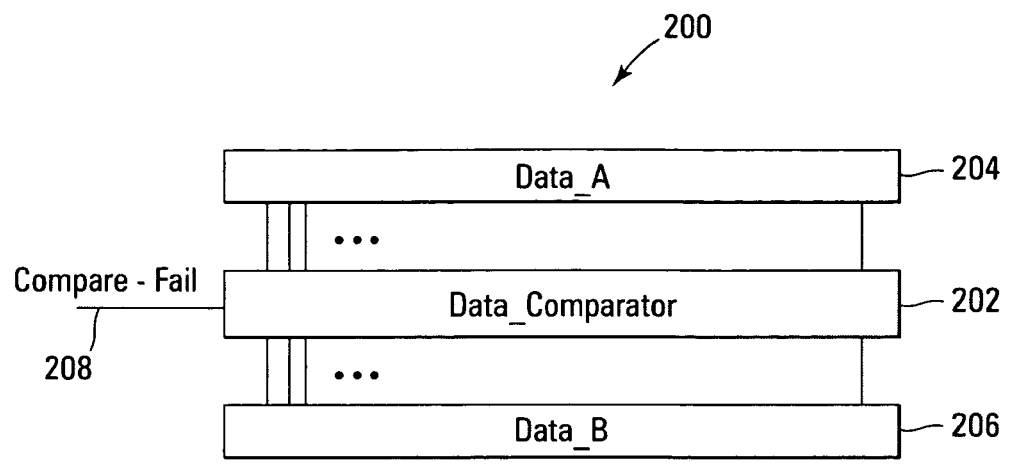
FIG. 2 details a data comparison circuit in accordance with an embodiment of the present invention.
Figure 3:
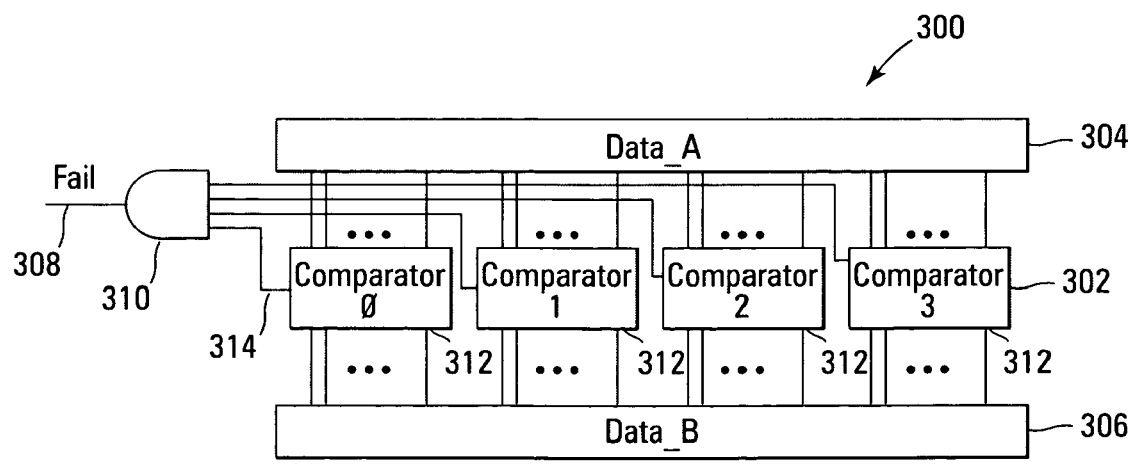
FIG. 3 details a data comparison circuit in accordance with another embodiment of the present invention.

FIGS. 2 and 3 detail simplified data comparison circuits 200, 300 of two embodiments of the present invention. In FIG. 2, a data comparison circuit 200 has a data comparator 202 coupled between two data registers or sources, Data_A 204 and Data_B 206, that contain the data bits of two data segments which are to be compared. The data comparator 202 compares the matching individual bit pairs of Data_A 204 and Data_B 206 and signals a match or mismatch of the two data segments on the signal line Compare_Fail 208, a logic high for a match and a logic low for a mismatch.

In FIG. 3, a data comparison circuit 300 has a data comparator 302 coupled between two data registers or sources, Data_A 304 and Data_B 306. The data comparator 302 is broken into multiple comparison sections 312. Each data comparator section 312 compares different sections of the data bits of the data segments held in Data_A 304 and Data_B 306 and generates a data match/mismatch signal 314 for its individual section of data. The data match/mismatch signals are then gathered together by AND gate 310 to generate a global data match/mismatch signal 308 for the data segments held in Data_A 304 and Data_B 306. If a data mismatch is signaled by the global data match/mismatch signal 308, the section(s) of the data segments held in Data_A 304 and Data_B 306 that contain data mismatches can be quickly found by examining the data match/mismatch signals 314 of the individual section data comparators 312.

FIGS. 4A, 4B, and 4C detail simplified diagrams of portions of a data comparison circuit 202, 302 of embodiments of the present invention. In FIG. 4A a portion of a data comparison circuit 400 having data registers 404, 406 coupled between a data comparator circuit 402 is shown. The individual bits of each data register 404, 406 (data cache register 404, sense amplifier 406) are stored in latches formed by feedback coupled inverters 408 such that each register position has a data and a data_output. The data comparator circuit 402 having a plurality of individual bit data comparators 416 each coupled to a corresponding bit position of each data register 404, 406. Each individual bit data comparator 416 is also coupled to a common error (data match/mismatch) signal line 410. A pull-up circuit 412, comprising a pull-up resistor, is also coupled to the common error signal line 410. The pull-up circuit 412 pulls the common error signal line 410 to a high signal level if it is not pulled down by one or more of the individual bit comparators 416. An expanded diagram of a bit comparator 430 is detailed in FIG. 4B. The individual bit comparators 416 comprise four transistors 418 that are coupled in two series-coupled chains 440, 442 between the common error signal line 410 and ground (or a power rail that is at a logical low signal level voltage). The gate inputs of transistors 418 of each bit comparator 416 are cross coupled to the data and data_outputs of the data registers 404, 406 (Data_A 432, Data_A_434, Data_B436, and Data_B_438 in FIG. 4B) such that the gate inputs of the transistors 418 a first 442 of the two series-coupled chains are coupled to the data output (Data_A 432) of data register 404 and the data_output (Data_B_438) of data register 406, and the gate inputs of the transistors 418 of a second 440 of the two series-coupled chains are coupled to the data output (Data_B 436) of data register 406 and the data_output (Data_A_434) of data register 404. If the data bits stored in the individual data bit position of the data registers 404, 406 are the same, only a single transistor 418 of each of the first and second series-coupled chains 440, 442 of the data bit comparator 416 are turned on, while the other transistor 418 of each series-coupled chain remains off and no circuit path to ground is created. If the data bits stored in the data bit position of the data registers 404, 406 differ, both transistors 418 of one of the first or second series-coupled chains 440, 442 of the data bit comparator 416 are turned on, coupling the common error bit line to ground (the transistors 418 of the other series-coupled chain are both turned off). This pulls down the common error signal line and indicates a data bit mismatch in the data segments stored in the data registers 404, 406.

In an inverted logic data comparator, the common error line is clamped at a low logic signal level, such as ground, by a pull-down circuit and the series-coupled transistor chains 440, 442 of each bit comparator couples the common error signal line to a logic high signal level, such as the positive voltage rail, when the data bits of the coupled data registers differ.

The series-coupled transistor 418 chains of each bit comparator, with their cross coupled control gate inputs, implement an open collector XNOR logic function on the bits of the data register they are coupled to, pulling down the common error signal line 410 when a mismatch is detected. A simplified logic gate diagram embodiment of the present invention detailing an open collector XNOR gate 452 is shown in FIG. 4C. In FIG. 4C, an open collector XNOR gate 452 is coupled to data bit inputs Data_A 432 and Data_B 436. The open collector output of the XNOR gate 452 is coupled to the common error signal line 410 and pulls it down to ground if a data bit mismatch is detected between data bit inputs Data_A 432 and Data_B 436. In an inverted logic data comparator, the common error line is clamped at a low logic signal level, such as ground, by a pull-down circuit and each bit comparator comprises a modified open collector XOR gate that couples the common error signal line to a logic high signal level, such as the positive voltage rail, when activated, instead of a logic low.

It is noted that other data comparisons and comparison circuits for memory embodiments of the present invention are possible and will be apparent to those skilled in the art with benefit of the present disclosure.

CONCLUSION

An improved non-volatile memory device and data comparison circuit have been described that facilitate the comparison of data between two blocks of data, such as the I/O buffer or data cache of a memory and the sense amplifiers, that allow for simple and rapid comparison of small or large numbers of data bits and results in a signal flag indicating a data match or a mis-match. This allows for a simple parallel data bit comparison capability that allows a fast initial comparison result without requiring a time-consuming individual bit-by-bit data comparison. In one embodiment of the present invention, two data blocks to be compared are divided into a number of paired segments, wherein each pair of segments are compared in parallel by a data comparison circuit, such that a mis-match can be located to the affected data segments or the results logically combined to indicate a match or mis-match for the complete data blocks.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A memory device, comprising:
   a memory array having a plurality of memory cells arranged in rows and columns;
   a plurality of sense amplifiers coupled to the memory array;
   a data cache coupled to the plurality of sense amplifiers; and
   a data comparison circuit coupled between the data cache and the plurality of sense amplifiers, wherein the data comparison circuit contains a plurality of bit comparators, each of the plurality of bit comparators having an output directly coupled to a common error signal line, and where each bit comparator of the plurality of bit comparators is adapted to compare a first data value held in a sense amplifier of the plurality of sense amplifiers with a second data value held in the data cache and express a data match or data mismatch signal from an output of a bit comparator directly on the common error signal line,
   wherein the data comparison circuit further comprises:
      a pull-up circuit coupled to the common error signal line; and
      wherein each bit comparator of the data comparison circuit has a first and second data input, wherein the first data input is coupled to an output of the sense amplifiers and the second data input is coupled to an output of the data cache, and where each of the plurality of bit comparators is directly coupled to the common error signal line with an open collector output;
   wherein each bit comparator further comprises:
      an open collector XNOR gate having a first and second inputs and an open collector output, wherein the first XNOR input is coupled to the first data input, the second XNOR input is coupled to the second data input, and the open collector output is coupled directly to the common error signal line.

2. The memory device of claim 1, wherein each bit comparator further comprises:
   a first series-coupled transistor chain, having a first and second transistors coupled in series, wherein the first series-coupled chain is coupled to the common error signal line and to a low signal level power rail, and where a control gate of the first transistor is coupled to a normal signal of the first data input and a control gate of the second transistor is coupled to a inverted signal of the second data input; and
   a second series-coupled transistor chain, having a first and second transistors coupled in series, wherein the second series-coupled chain is coupled to the common error signal line and to a low signal level power rail, and where a control gate of the first transistor is coupled to a inverted signal of the first data input and a control gate of the second transistor is coupled to a normal signal of the second data input.

3. The memory device of claim 1, wherein the data comparison circuit further comprises:
   an AND gate, wherein an output of the AND gate is coupled to the common error signal line; and
   a plurality of data section comparators, each data section comparator comprising:
      a first and second data input, wherein the first data input is coupled to a section of the outputs of the sense amplifiers and the second data input is coupled to a section of the output of the data cache, and
      a local common error signal line coupled to a local pull-up circuit, wherein the local common error signal line is coupled to an input of the AND gate,
      wherein each data section comparators of the plurality of data section comparators contains a plurality of bit comparators, each of the plurality of bit comparators having an output directly electrically coupled to the local common error signal line, and where each bit comparator of the plurality of bit comparators is adapted to compare a selected data value of the data values expressed on the first data inputs with a selected data value of the data values expressed on the second data inputs and express an active data match or data mismatch signal from the output of the bit comparator directly on the local common error signal line.

4. The memory device of claim 1, wherein the memory device is a non-volatile memory device.

5. The memory device of claim 4, wherein the non-volatile memory is one of a EEPROM memory device, a NAND Flash memory device, a NOR Flash memory device, a Polymer memory device, a Ferroelectric Random Access Memory (FeRAM) device, an Ovionics Unified Memory (OUM) device, a Nitride Read Only Memory (NROM) device, a Magnetoresistive Random Access Memory (MRAM) device, a Molecular Memory device, a Nitride Read Only Memory (NROM) memory device, and a Carbon Nanotube Memory device.

6. The memory device of claim 1, wherein the memory device further comprises a synchronous memory interface.

7. The memory device of claim 6, wherein the synchronous memory interface further comprises one of a SDRAM memory interface and a DDR-SDRAM memory interface.

8. A system comprising:
a host coupled to a memory device, wherein the memory device comprises:
    a memory array having a plurality of memory cells arranged in rows and columns;
    a plurality of sense amplifiers coupled to the memory array;
    a data cache coupled to the plurality of sense amplifiers; and
    a data comparison circuit coupled between the data cache and the plurality of sense amplifiers, wherein the data comparison circuit contains a plurality of bit comparators, each of the plurality of bit comparators having an output directly coupled to a common error signal line, and where each bit comparator of the plurality of bit comparators is adapted to compare a bit position of a plurality of data values held in the sense amplifiers with a bit position of a plurality of data values held in the data cache and express a data match or data mismatch signal from an output of a bit comparator directly on the common error signal line,
wherein the data comparison circuit further comprises:
    a pull-up circuit coupled to the common error signal line; and
    wherein each bit comparator of the data comparison circuit has a first and second data input, wherein the first data input is coupled to an output of the sense amplifiers and the second data input is coupled to an output of the data cache, and where each of the plurality of bit comparators is coupled directly to the common error signal line with an open collector output; and
wherein each bit comparator further comprises:
    an open collector XNOR gate having first and second inputs and an open collector output, wherein the first XNOR input is coupled to the first data input, the second XNOR input is coupled to the second data input, and the open collector output is connected to the common error signal line.

9. The system of claim 8, wherein the host is one of a processor or a memory controller.

10. The system of claim 8, wherein the memory device is one of a NAND Flash memory device and a NOR Flash memory device.

11. The system of claim 8, wherein the memory device further comprises one of a SDRAM memory interface and a DDR-SDRAM memory interface.

12. The system of claim 8, wherein each bit comparator further comprises:
    a first series-coupled transistor chain, having a first and second transistors coupled in series, wherein the first series-coupled chain is coupled to the common error signal line and to a low signal level power rail, and where a control gate of the first transistor is coupled to a normal signal of the first data input and a control gate of the second transistor is coupled to a inverted signal of the second data input; and
    a second series-coupled transistor chain, having a first and second transistors coupled in series, wherein the second series-coupled chain is coupled to the common error signal line and to a low signal level power rail, and where a control gate of the first transistor is coupled to a inverted signal of the first data input and a control gate of the second transistor is coupled to a normal signal of the second data input.

13. The system of claim 8, wherein the data comparison circuit further comprises:
    an AND gate, wherein an output of the AND gate is coupled to the common error signal line; and
    a plurality of data section comparators, each data section comparator comprising:
        a first and second data input, wherein the first data input is coupled to a section of the outputs of the sense amplifiers and the second data input is coupled to a section of the output of the data cache, and
        a local common error signal line coupled to a local pull-up circuit, wherein the local common error signal line is coupled to an input of the AND gate,
        wherein each data section comparators of the plurality of data section comparators contains a plurality of bit comparators, each bit comparator of the plurality of bit comparators having an output directly coupled to the local common error signal line, and where each bit comparator of the plurality of bit comparators is adapted to compare a selected data value of a plurality of data values expressed on the first data inputs with a selected data value of a plurality of data values expressed on the second data inputs and electrically express a data match or data mismatch directly on the local common error signal line.

14. A method of operating a memory, comprising:
reading a first data segment from a memory array utilizing a plurality of sense amplifiers;
comparing each bit position of the first data segment held in the sense amplifiers with a corresponding bit position of a second data segment held in a data cache with an associated bit comparator of a plurality of bit comparators;
reading one or more data segments from the memory array and comparing them against a pattern of data values held in the data cache to locate the pattern of data values in the memory array;
electrically asserting a signal directly on a common error signal line for each bit position of the first and second data segments if the bit position of the first and second data segments mismatch with an output of the bit comparator associated with the bit position.

15. The method of claim 14, wherein comparing each bit position of the first data segment held in the sense amplifiers with a corresponding bit position of a second data segment held in a data cache with an associated bit comparator of a plurality of bit comparators and electrically asserting a signal directly on a common error signal line for each bit position of the first and second data segments if the bit position of the first and second data segments mismatch with an output of the bit comparator associated with the bit position further comprises comparing each bit position of the first data segment with a corresponding bit position of a second data segment with a plurality of bit comparators, where each bit comparator directly pulls down the common error signal line if a first input from the first data segment miscompares with a second input from the second data segment.

16. The method of claim 15, further comprising pulling up the common error signal line with one of a pull-up resistor and a weak transistor.

17. The method of claim 14, wherein comparing each bit position of the first data segment held in the sense amplifiers with a corresponding bit position of a second data segment held in a data cache with an associated bit comparator of a plurality of bit comparators and electrically asserting a signal directly on a common error signal line for each bit position of the first and second data segments if the bit position of the first and second data segments mismatch with an output of the bit comparator associated with the bit position further comprises comparing each bit position of the first data segment with a corresponding bit position of a second data segment with a plurality of bit comparators, where each bit comparator directly pulls up the common error signal line if a first input from the first data segment miscompares with a second input from the second data segment.

18. The method of claim 17, further comprising pulling down the common error signal line with one of a pull-down resistor and a weak transistor.

19. The method of claim 14, wherein reading a first data segment from a memory array utilizing a plurality of sense amplifiers and comparing each bit position of the first data segment held in the sense amplifiers with a corresponding bit position of a second data segment held in a data cache further comprises reading a recently written data segment from the memory array and comparing it against an original data segment held in the data cache to verify it.

20. The method of claim 14, wherein reading a first data segment from a memory array utilizing a plurality of sense amplifiers and comparing each bit position of the first data segment held in the sense amplifiers with a corresponding bit position of a second data segment held in a data cache further comprises reading a recently erased data segment from the memory array and comparing it against erased data values held in the data cache to verify proper erasure.

* * * * *